United States Patent [19]

Tuda et al.

[11] Patent Number: 5,132,937
[45] Date of Patent: Jul. 21, 1992

[54] SEMICONDUCTOR MEMORY DEVICE HAVING ON-CHIP TEST CIRCUIT AND OPERATING METHOD THEREOF

[75] Inventors: Nobuhiro Tuda; Yutaka Arita, both of Hyogo, Japan

[73] Assignee: Mitsubishi Denki Kabushiki Kaisha, Tokyo, Japan

[21] Appl. No.: 527,205

[22] Filed: May 23, 1990

[30] Foreign Application Priority Data

Jun. 1, 1989 [JP] Japan ................. 1-141522

[51] Int. Cl.⁵ .................. G11C 7/00; G11C 29/00
[52] U.S. Cl. ..................... 365/201; 365/233.5
[58] Field of Search ........... 365/201, 233.5, 189.03; 371/21.1, 21.2

[56] References Cited

U.S. PATENT DOCUMENTS

| | | | |
|---|---|---|---|
| 4,541,090 | 9/1985 | Shiragasawa | 371/21.2 |
| 4,549,101 | 10/1985 | Sood | 365/201 |
| 4,752,929 | 6/1988 | Kantz et al. | 371/21.2 |
| 4,768,194 | 8/1988 | Fuchs | 371/21.2 |
| 4,833,652 | 5/1989 | Isobe et al. | 365/201 |
| 4,849,973 | 7/1989 | Kubota | 365/201 |
| 4,860,259 | 8/1989 | Tobita | 365/201 |
| 4,868,823 | 9/1989 | White, Jr. et al. | 365/201 |
| 4,897,817 | 1/1990 | Katanosaka | 365/201 |
| 4,899,313 | 2/1990 | Kumanoya et al. | 365/201 |
| 4,956,819 | 9/1990 | Hoffmann et al. | 365/201 |

FOREIGN PATENT DOCUMENTS 62-170100 7/1987 Japan .

OTHER PUBLICATIONS

Pinaki Mazumder, "Parallel Testing of Parametric Faults in a Three-Dimensional Dynamic Random-Access Memory", Aug. 1988, IEEE Journal of Solid-State Circuits, vol. 23, No. 4, pp. 933–940.

Primary Examiner—Stuart N. Hecker
Assistant Examiner—Michael A. Whitfield
Attorney, Agent, or Firm—Lowe, Price, LeBlanc & Becker

[57] ABSTRACT

Same test data is written into corresponding memory cells of each subarray of a memory cell array to be read out. A comparing and determining circuit determines whether the data read out from each memory cell has the same logic or not, and the data proves defective when any one of the data has different logic. An output of the comparing and determining circuit is stored in a register to be externally outputted through a predetermined pin (e.g. output enable pin). Timing in which the register accepts the data stored in the comparing and determining circuit is controlled by a switching controlling signal generating circuit disposed in a semiconductor memory device. As the above, all signals necessary for a test are generated in the semiconductor memory device, and the test result is outputted through an existing pin, so that it is structured by the same number of pins as that of a standard semiconductor memory device without a testing function.

8 Claims, 8 Drawing Sheets

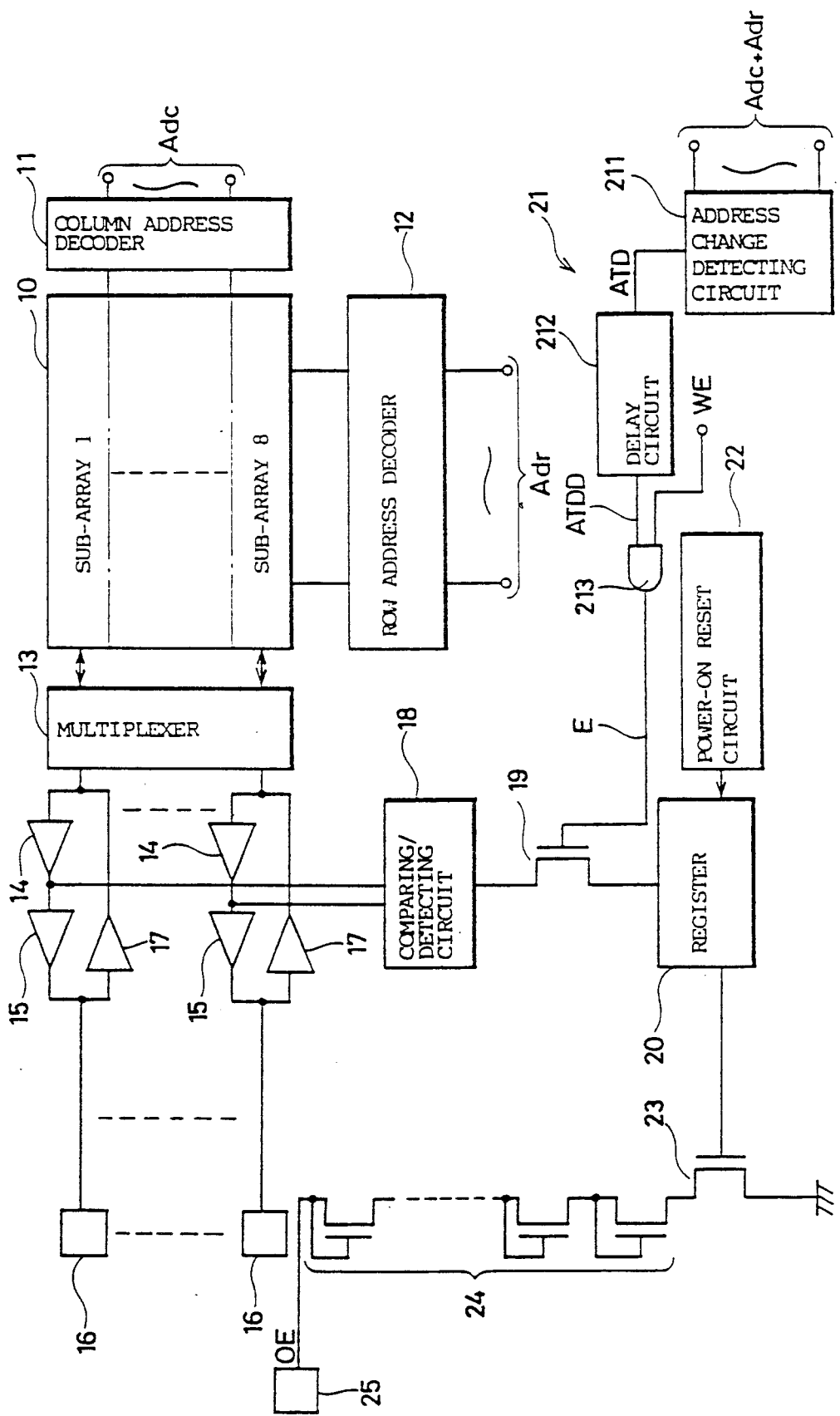

FIG.4A ADDRESS
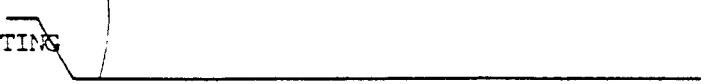
FIG.4B CHIP SELECTING SIGNAL
FIG.4C READ/WRITE DESIGNATING SIGNAL
FIG.4D INPUT DATA
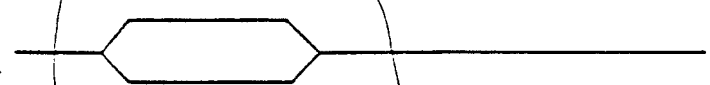
FIG.4E ADDRESS CHANGE DETECTING SIGNAL
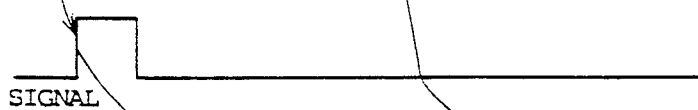
FIG.4F TEST RESULT OUTPUTTING ENABLE SIGNAL
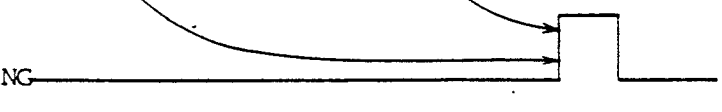
FIG.4G OUTPUT ENABLE SIGNAL
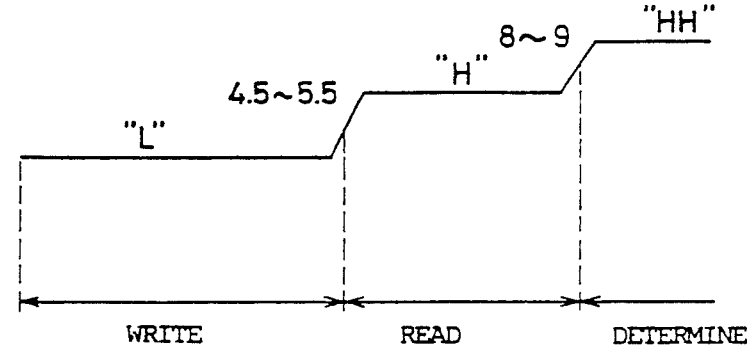

SEMICONDUCTOR MEMORY DEVICE HAVING ON-CHIP TEST CIRCUIT AND OPERATING METHOD THEREOF

BACKGROUND OF THE INVENTION

1. Field of the Invention

The present invention relates generally to testing semiconductor memory devices, and more specifically, to a semiconductor memory device having on-chip testing circuit for testing memory cells.

2. Description of the Background Art

As semiconductor memory devices have been highly integrated in recent years, drawbacks of which tend to be increased. Therefore, a test circuit of a semiconductor memory device is needed. In order to reduce test time, proposed or implemented is a provision of a test circuit in the semiconductor memory device.

FIG. 1 is a block diagram showing a conventional semiconductor memory device having a built-in test circuit which is described in the Japanese Patent Laying Open (KOKAI) No. 62-170100. In the drawing, the semiconductor memory device 1 comprises a memory cell array 2, a row address decoder 3, a column address decoder 4 and a sense amplifier 5, and is supplied with address signals A0-A7, a read/write signal W and write data D. Further, the semiconductor memory device 1 comprises a test circuit 6.

When the read/write signal W is a logical "0", write data D is written into cells selected by the address signals A0-A7. When the read/write signal W is a logical "1", contents of cells selected by the address signals A0-A7 are read out as RAM output 0.

The test circuit 6 built in the semiconductor memory device of FIG. 1 comprises a comparator C and a register R for storing test results.

The RAM output 0 is applied to one input of the comparator C, and an externally applied signal of expected value E is applied to the other input of the comparator C. When these two inputs are not coincident, the comparator C outputs a logical "0", which is applied to the register R. Before starting a test, the register R is set for the logical "1" by a set signal S. The register R accepts the contents of input when an externally inputted enable signal T is the logical "1". Once the register R becomes the logical "0", it holds the same unless a set signal S is applied. A test result signal F becomes the logical "0" only when the RAM output 0 and the signal of expected value E are not coincident in testing, so that the memory cell proves defective.

Now, testing operation of the semiconductor memory device shown in FIG. 1 will be described.

FIG. 2 is a diagram of a system structure showing one example of a memory testing system for testing the semiconductor memory device shown in FIG. 1.

In the memory testing system shown in FIG. 2, a memory testing machine TM provides to respective semiconductor memory devices M0-M3-Mn to be tested an input signal group D, a signal of expected value E, a set signal S for setting a register and an enable signal T indicating whether a register is to operate or not. Test results are detected by light emitting diodes L connected external to respective semiconductor memory devices. As a result of the test, if there is a defect, a light emitting diode L lights up, so that corresponding one of the semiconductor memory devices M0-Mn can be removed.

In this case, as far as driving capacity of the input signal driver of the memory testing machine TM permits, many semiconductor memory devices can be connected in parallel to be simultaneously tested.

As such memory testing machine TM as described above, for example, ANDO 8042, product of Ando Electric Co., Ltd. is known.

Since a conventional semiconductor memory device is structured as the above, a total of four terminals, that is, a terminal for inputting a signal of expected value E, a terminal for inputting a set signal S, a terminal for inputting an enable signal T and a terminal for outputting a test result F are necessary for a test circuit. Therefore, the number of pins becomes larger as compared with a standard semiconductor memory device without a built-in test circuit. As a result, it is not compatible with standard semiconductor memory devices, so that it is of little practice.

In addition, since a device for generating the foregoing signals E, S and T for a test is required, its test system becomes complicated, thereby making a memory test device expensive.

SUMMARY OF THE INVENTION

One object of the present invention is to reduce time required for testing semiconductor memory devices.

Another object of the present invention is to test semiconductor memory devices without using additional pins for a test circuitry.

Yet another object of the present invention is to provide on-chip test circuitry for semiconductor memory devices that is simple in construction.

Still another object of the present invention is to provide semiconductor memory devices together with function testing circuitry disposed on a common semiconductor substrate.

Yet another object of the present invention is to implement on-chip function testing circuitry with a semiconductor memory device using only standard existing pins.

Still another object of the present invention is to reduce a testing time of a semiconductor memory device.

The semiconductor memory device according to the present invention comprises a memory array, a plurality of function terminals, decoding means, comparing means and defect signal applying means. The memory cell array has a plurality of memory cells divided into a plurality of subarrays. The plurality of function terminals carry input and output signals to control functions of the memory device. The decoding means designates corresponding memory cells in the subarrays for writing data to and reading data from the subarrays. The comparing means compares data read out from corresponding memory cells in the subarrays and generates a defect signal if data stored in any of the corresponding memory cells of a subarray are not coincident. The defect signal applying means applies the defect signal to a predetermined one of the function terminals of the memory device.

In the present invention, a memory cell array is tested whether it is defective or not by writing the same data to corresponding memory cells in each subarray of the memory array, reading the data from the memory cells to determine whether all of the data are coincident or not by means of comparing means. The determination output of the comparing means is applied to one of the function terminals provided in the memory device. The function terminals carry input and output signals to control functions of the memory device and are provided also in a standard semiconductor memory device containing no testing function. Accordingly, no more pins are required than those of a standard semiconductor memory device not containing no testing function.

More specifically, according to the present invention, since a semiconductor memory device having a testing function can be structured by the same number of pins as that of a standard semiconductor memory device having no built-in test function, it is compatible with a standard semiconductor memory device, so that it is highly practical. In addition, since no signal for testing needs to be generated external to a semiconductor memory device, it can be tested with a simple memory testing device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a block diagram showing a semiconductor memory device according to one embodiment of the present invention.

FIGS. 4A to 4G are timing charts for explaining operations of the embodiment shown in FIG. 3A.

DESCRIPTION OF THE PREFERRED EMBODIMENT

Figure 3B:
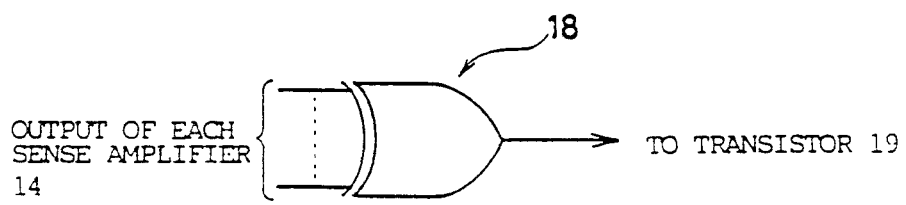
FIGS. 3B, 3C and 3D are circuit diagrams showing detailed structures of the comparing and determining circuit, the address change detecting circuit and the delay circuit of FIG. 3A, respectively.
Figure 3C:
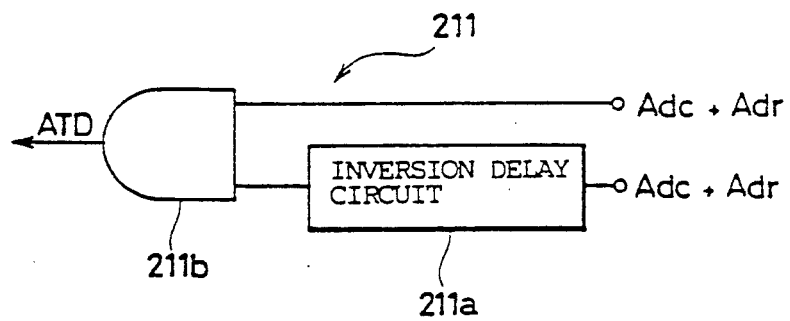
Figure 3D:
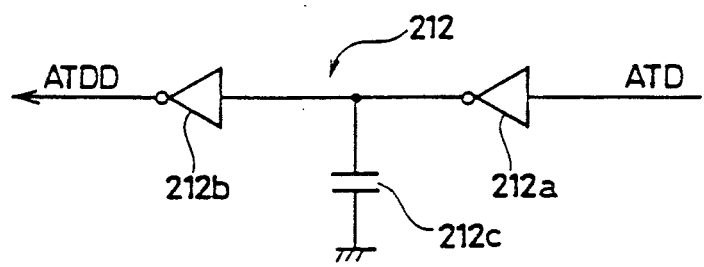
Figure 5A:
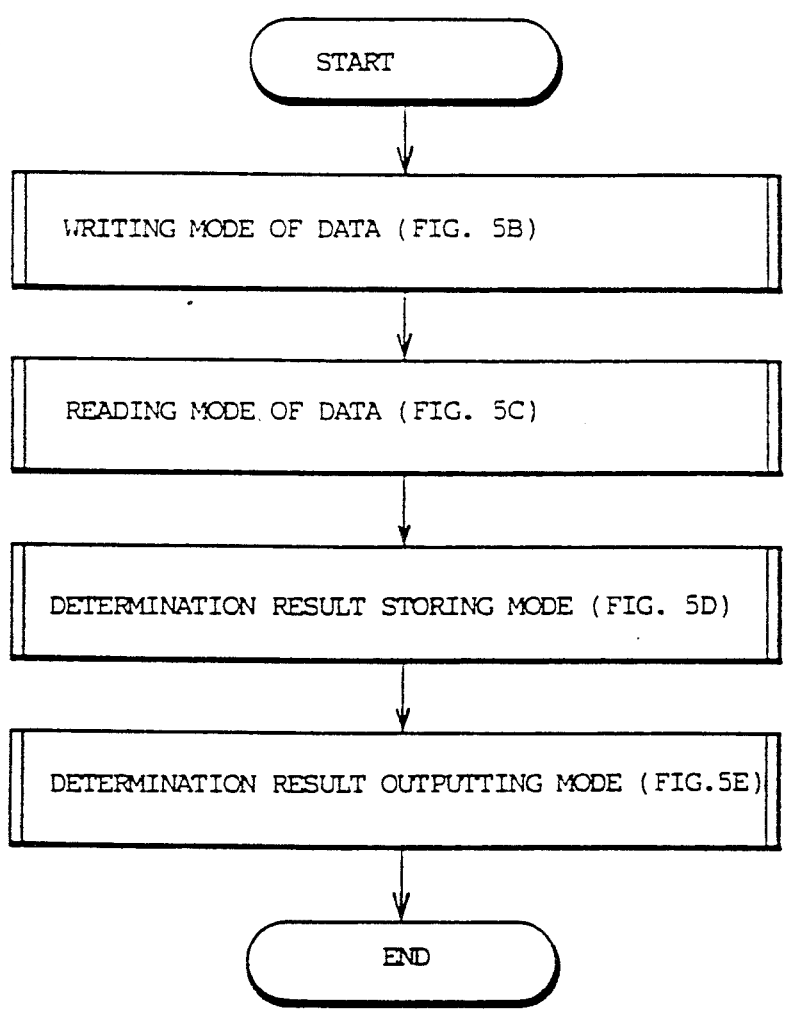
FIGS. 5A to 5E are flow charts for explaining operations of the embodiment shown in FIG. 3A.
Figure 5B:
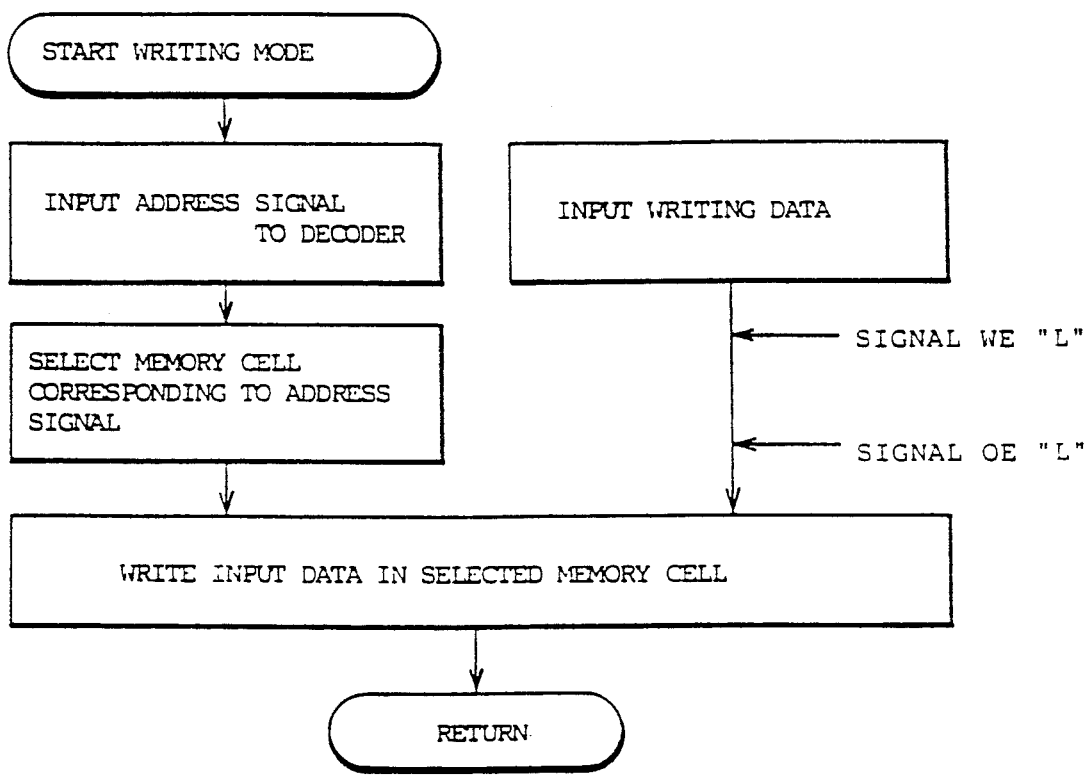
Figure 5C:
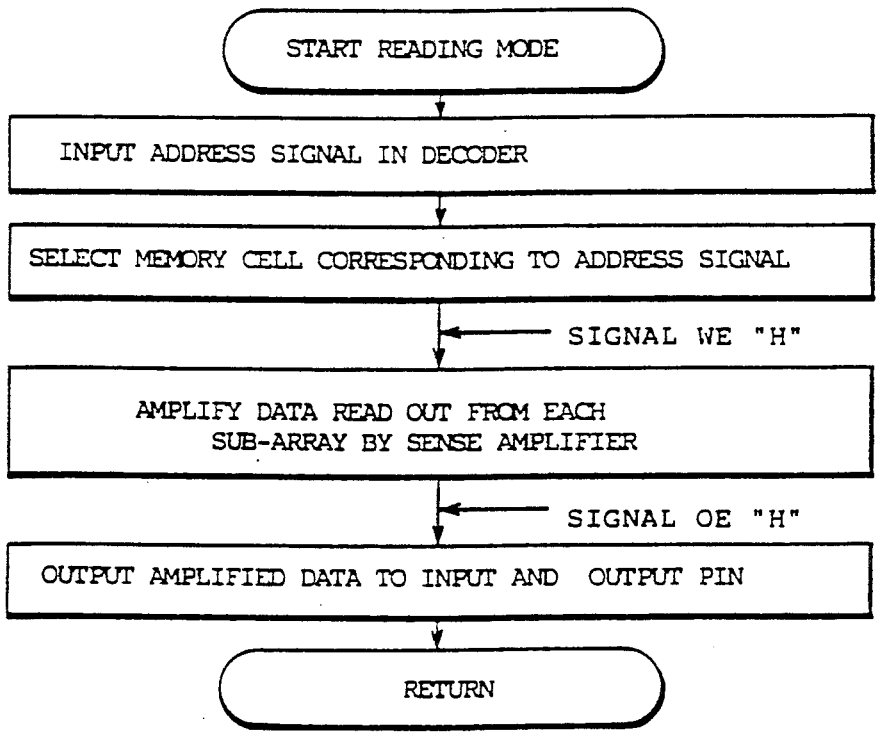
Figure 5D:
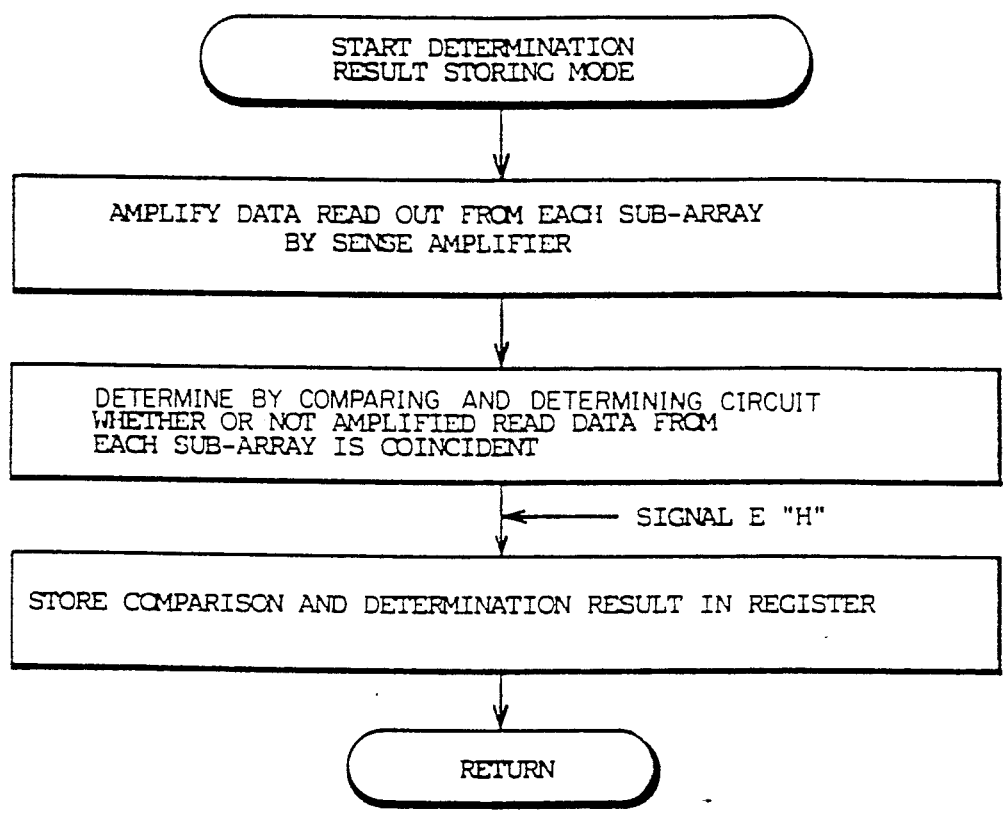
Figure 5E:
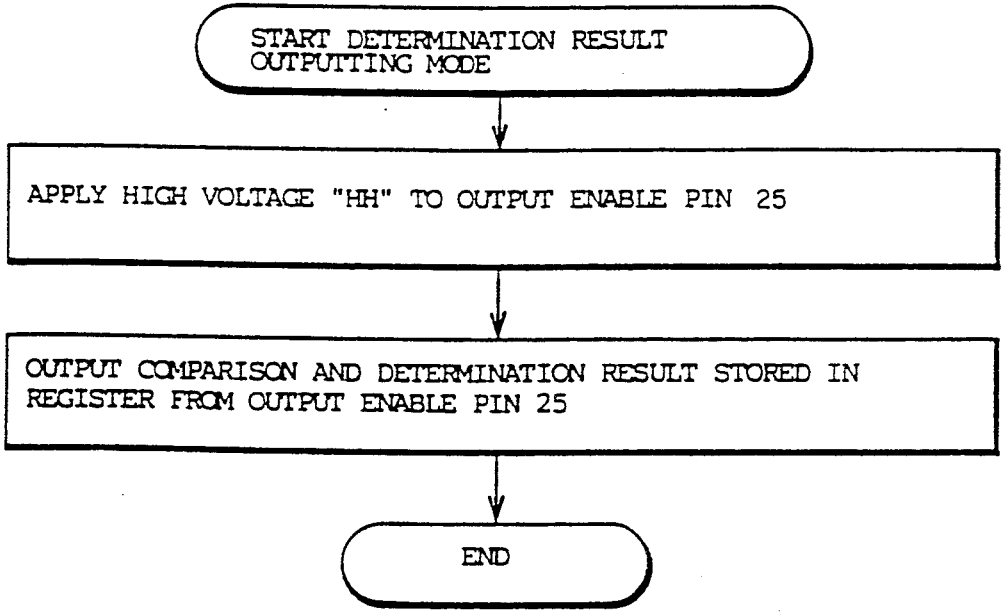

FIG. 3A is a block diagram showing one embodiment of the present invention. In the drawing, a plurality of the memory cells are disposed in matrix in a memory cell array 10, wherein respective memory cells are divided into 8 subarrays. A column address decoder 11 selects a corresponding column of respective subarrays based on an externally applied column address signal Adc. A row address decoder 12 selects a corresponding row of respective subarrays based on an externally applied row address signal Adr. Each subarray is connected to each of eight sense amplifiers 14 through a multiplexer 13. Each output of the sense amplifiers 14 is applied to eight data input/output pins 16 through a data output buffer 15. The input data applied to the data input/output pins 16 is applied to the multiplexer 13 through a data input buffer 17. Each output of the sense amplifiers 14 is applied to a comparing/determining circuit 18. The comparing and determining circuit 18 comprises as shown in FIG. 3B, for example, an Exclusive OR circuit, and determines whether all logic of outputs of the 8 sense amplifiers 14 is coincident or not. An output of the comparing and determining circuit 18 is applied to a register 20 through a gate transistor 19. Switching of the gate transistor 19 is controlled by a test result outputting enable signal E generated by a switching control signal generating circuit 21. The switching control signal generating circuit 21 comprises an address change detecting circuit 211 for detecting changes of the inputted column address signal Adc and row address signal Adr, a delay circuit 212 for delaying an ATD pulse which is an output of the address change detecting circuit 211, and an AND gate 213 for receiving at its one input an output ATDD of the delay circuit 212, while a write/read designating signal WE is applied to the other input of the AND gate 213. The address change detecting circuit 211 comprises as shown in FIG. 3C, for example, an inversion delay circuit 211a and an AND gate 211b. Namely, the AND gate 211b causes ATD pulse to attain the "H" level while the address signal rises and after a predetermined lapse of time an inversion delay signal thereof falls. In addition, the delay circuit 212 comprises as shown in FIG. 3D, for example, two inverters 212a and 212b and a capacitor 212c. An output of a power-on reset circuit 22 is applied as a reset signal to the register 20. The power-on reset circuit 22 generates a pulse to initially reset the register 20 when a power supply of the semiconductor memory device of FIG. 3 is switched on. An output of the register 20 is applied to a gate of an N-channel type transistor 23. A source of the transistor 23 is grounded, while a drain of the transistor 23 is connected to an output enable pin 25 through a plurality of N-channel transistors 24. Each transistor 24 is diode-connected with each other, so that each forward resistance drop is employed to change input impedance of the output enable pin 25. The above described structure of FIG. 3A is disposed on a single semiconductor substrate. In periphery of the semiconductor memory device are a plurality of function terminals including data input/output pins 16, pins for inputting the column address signal Adc and the row address signal Adr, a pin for inputting the write/read designating signal WE, and the output enable pin 25 are provided. Respective pins are also employed in a standard semiconductor memory device without a testing function.

Now, operation of the embodiment shown in FIG. 3A will be described with reference to the time chart of FIGS. 4A to 4G and mane wave forms.

(1) Operation of Writing Mode

When the column address signal Adc is inputted into the column address decoder 11, and the row address signal Adr is inputted into the row address decoder 12, corresponding memory cells of each subarray in the memory cell array 10 are selected. At this time, as shown in FIG. 4C, the read/write designating signal WE attains the "L" level, so that the input data DI (inputted from the data input and output pin 16) shown in FIG. 4D is written into each of the selected memory cells through the data input buffer 17. In this writing mode, the output enable signal OE applied to the output enable pin 25 attains the "L" level, that is, 0V as shown in FIG. 4G.

(2) Operation of Reading Mode

Then, as shown in FIG. 4C, when the read/write designating signal WE attains the "H" level, data stored in each memory cell is outputted to the data input/output pins 16 through the sense amplifiers 14 and the data output buffer 15. In this reading mode, the output enable signal OE attains the "H" level((about 4.5–5.5V) as shown in FIG. 4G, wherein data can be outputted.

At this time, eight data read out from the corresponding memory cells of each subarray are amplified in the sense amplifiers 14 to be compared in the comparing and determining circuit 18, so that the memory cell array proves defective when any one of the data is different.

(3) Operation of Result Storing Mode

A short pulse of a test result outputting enable signal E (see FIG. 4F) which is a logical product of the delayed signal ATDD of the address change detecting signal ATD (see FIG. 4E) and read/write designating signal WE (see FIG. 4C) causes the gate transistor 19 to be turned on, so that the result in the comparing and determining circuit 18 is accepted by the register 20.

In the above described reading mode, if the transistor 19 is turned on before the comparing and determining circuit 18 takes a logical product of the read data from each subarray through the sense amplifier 14, data of the pseudo test result is accepted by the register 20. Accordingly, a timing of accepting in the register 20 an output of the comparing and determining circuit 18 is controlled by the control signal E having some margin for change of the address signal.

(4) Operation of Result Outputting Mode

Figure 1:
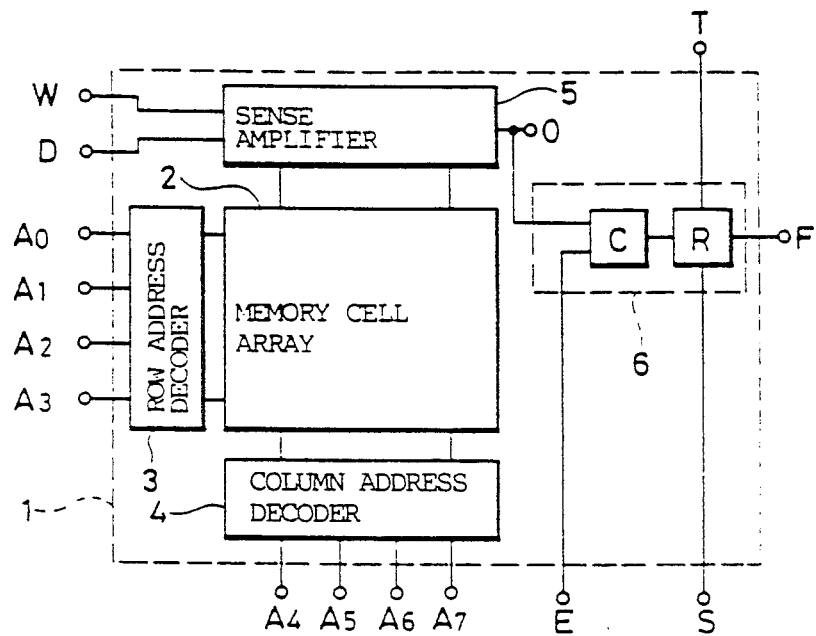
FIG. 1 is a block diagram showing a conventional semiconductor memory device.
Figure 2:
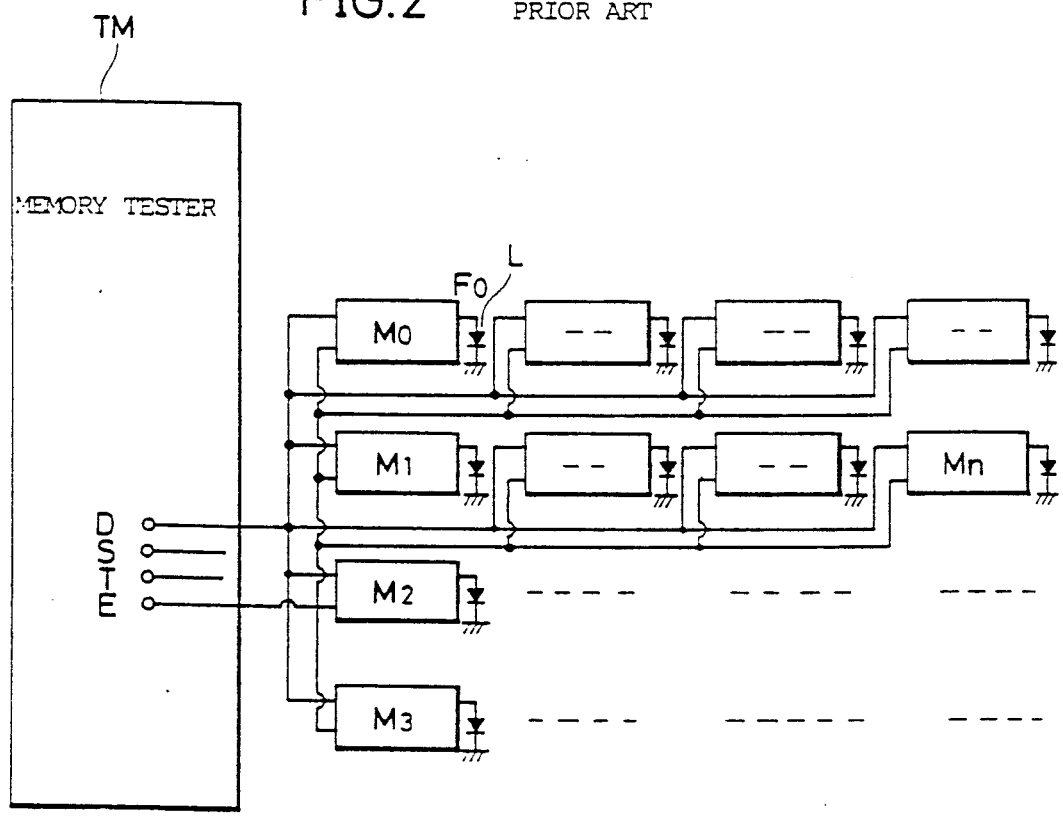
FIG. 2 is a diagram of a system structure showing one example of a memory testing system for testing the semiconductor memory device shown in FIG. 1.

In this mode, a signal of higher "HH" level than an ordinary "H" level is applied to the output enable pin 25 to which an output enable signal OE for controlling an output of ordinary data is inputted (see FIG. 4G). "HH" level is set at a voltage level within a range in which none of the other circuits connected to the output enable pin 25 is damaged (for example 8-9V). At this time, the transistor 23 is in on or off state depending on the data stored in the register 20. When it is in the on state, the input impedance of the output enable pin 25 decreases, so that a lot of leak currents flow. On the other hand, when the transistor 23 is in the off state, the input impedance of the output enable pin 25 is extremely high, so that almost no leak current flows. Accordingly, the result is detected by the external devices depending on whether the leak current exists or not. When a plurality of semiconductor memory devices are to be tested simultaneously, a plurality of semiconductor memory devices shown in FIG. 3A are loaded on a test board, so that a high voltage is sequentially applied to the output enable pin 25 of each semiconductor memory device from such a memory testing machine TM as shown in FIG. 2.

For the reference, the operations of the above described embodiment are shown in the flow charts of FIGS. 5A to 5E each showing the entire operation, details of the writing mode of the data, details of the reading mode of the data, details of the determination result storing mode and details of the determination result outputting mode, respectively.

As the foregoing, in the embodiment of FIG. 3A, since all the signals employed for a test circuit are generated in a semiconductor memory device and a test result is outputted through an existing pin, it can be structured by the same number of pins as that of a standard semiconductor memory device having no testing function, thereby having an extremely high compatibility with a standard semiconductor memory device having no testing function so that highly practical advantages can be obtained.

In the embodiment of FIG. 3A, since a timing of accepting a result in the register 20 is determined by the delayed signal ATDD of the address change detecting signal ATD, the timing is less restricted, so that it can be surely operated as a test circuit.

In addition, in the semiconductor memory device of FIG. 3A, not only change of a current of the output enable pin 25 is checked, but also quality of the semiconductor memory device can be determined, so that a test become possible even with a simple memory testing device having less accuracy of timing and the like.

Although in the above embodiment, data of a result stored in the register 20 is outputted from the output enable pin 25, it may be outputted from other existing pins in a standard semiconductor memory device. For example, it may be outputted from a pin to which the read/write designating signal WE is inputted.

In the embodiment shown in FIG. 3A, in case defect of the same logic occurs in each of the subarrays, determination can not be made as to whether it is defective or not only by comparing the outputs of the respective sense amplifiers 14. Then, a signal of expected value may be inputted into any one of a plurality of data input-/output pins 16, whereby an exclusive logical sum of the signal of expected value and an output from the memory cell is taken in the comparing and determining circuit 18, so that quality of semiconductor memory device can be determined. In this case, it is advantageous in that a defection can be detected even if all outputs of each subarray are defective in the same logical. Such structure of the embodiment is shown in FIG. 6.

Figure 6:
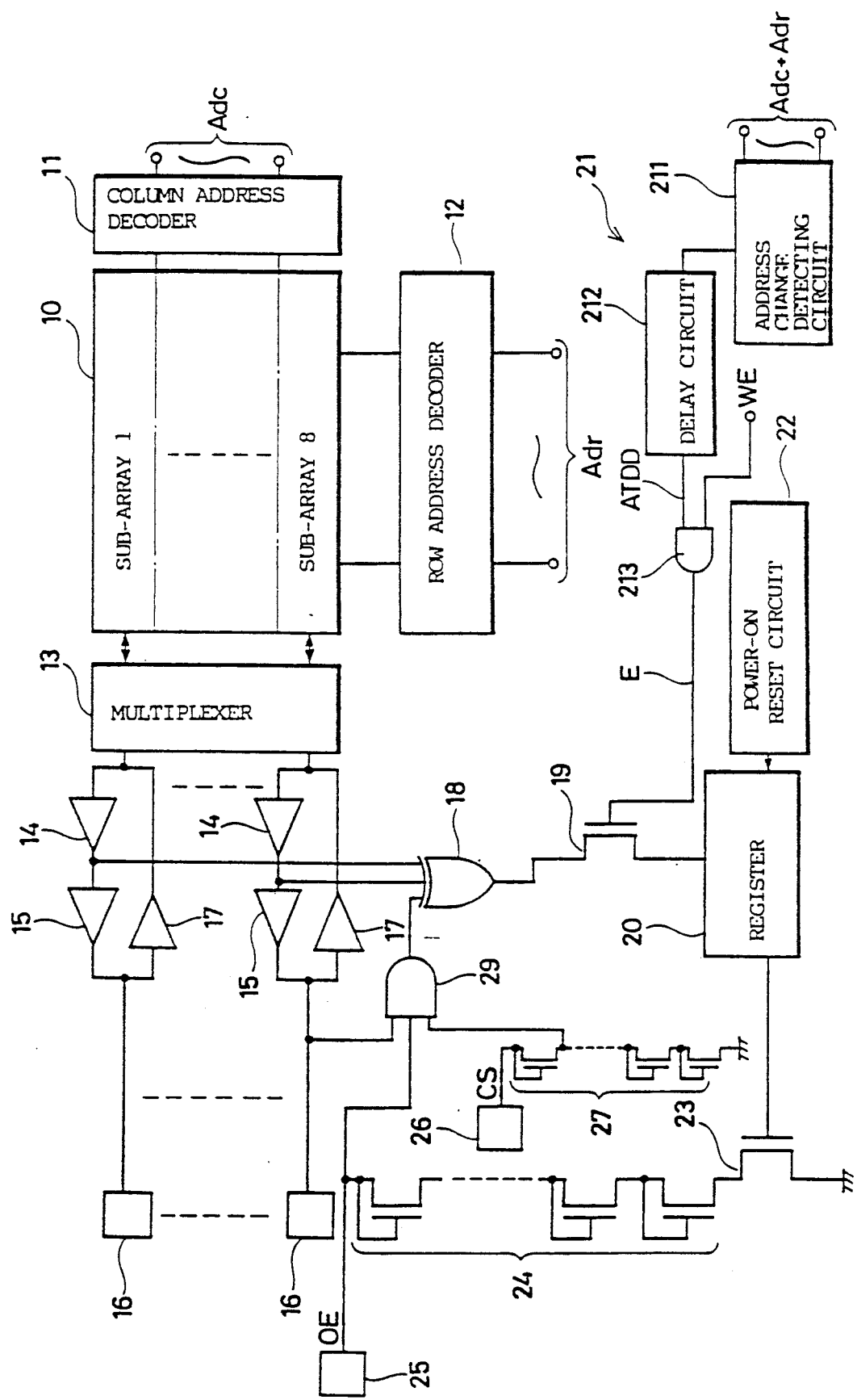
FIG. 6 is a block diagram showing a structure of another embodiment of the present invention.

In FIG. 6, a signal of expected value inputted from a predetermined data input and output pin 16 is applied to an AND gate 29. An output enable signal OE from an output enable pin 25 and a chip selecting signal CS from a chip selecting pin 26 are further applied to the AND gate 29.

Since an active level of the chip selecting signal CS is of a high potential, about 8-9V, the signal is applied to the AND gate 29 after converted into a signal having a voltage of an ordinary "H" level (about 4.5-5.5V) by the resistance dividing circuit comprising a plurality of series-connected N channel transistors 27. The output of the AND gate 29 is applied to a comparing and determining circuit 18 comprising exclusive logical sum gates.

Now, operations of another embodiment shown in FIG. 6 will be described. Operations in a writing mode are the same as those of the embodiment shown in FIG. 3A. In a reading mode, the output enable signal OE attains the "H" level. In addition, on this occasion a high voltage is applied to the chip selecting pin 26. Accordingly, the signal of expected value inputted from the data input and output pin 16 is applied to the comparing and determining circuit 18 through the gate 29, wherein the signal is compared with an output of each sense amplifier 14. Operations in the determination result storing mode and the determination result outputting mode are the same as those of FIG. 3A.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a testing function, comprising, on a single semiconductor substrate:

a memory cell array having a plurality of memory cells which are divided into a plurality of subarrays;

a plurality of data input/output pins provided for said memory cell array;

decoder means for designating corresponding memory cells in each subarray of said plurality of subarrays when writing input data to and reading output data from said plurality of subarrays, comparing and determining means for determining whether data read out from corresponding memory cells of said each subarray of said plurality of subarrays is coincident or not;

register means for storing a result of said comparing and determining means;

accepting timing controlling means for controlling timing in which said register means accepts the result of said comparing and determining means;

reset means for initially resetting said register means, and input impedance change means responsive to data held in said register means for changing input impedance of a predetermined data input/output pin.

2. A semiconductor memory device according to claim 1, wherein, said accepting timing controlling means comprises;

switching means interposed between said comparing and determining means and said register means; and switching controlling means for controlling a switching of said switching means.

3. A semiconductor memory device according to claim 2, wherein, said switching controlling means generates a signal for controlling a switching of said switching means based on signals defining an address applied to said decoder means and reading mode and writing mode of said memory cell array.

4. A semiconductor memory device according to claim 1, wherein a signal of expected value having like data as that written into said each memory cell for a test is inputted to any one of said plurality of data input-/output pins, said comparing and determining means determines whether said signal of expected value and all data read out from the corresponding memory cells of said each subarray of said plurality of subarrays are coincident or not.

5. A semiconductor memory device having a self-testing function, comprising:

a memory array having a plurality of memory cells divided into a plurality of subarrays;

a plurality of function terminals including a first plurality of input/output pins and a second plurality of other functional pins for carrying input and output signals to control functions of said semiconductor memory device, said input and output signals including signals not directed to results of said self-testing function;

decoder means for designating corresponding memory cells in said plurality of subarrays when writing data to and reading data from said plurality f subarrays;

means for comparing data read out from corresponding emory cells in said plurality of subarrays and for generating a defect signal if data stored in any of the corresponding memory cells of a subarray of said plurality of subarrays are not coincident;

means, responsive to a change of an address signal generated by said decoder means, for storing said defect signal in a register means; and means for applying said defect signal from said register means to one of said second plurality of other functional pins of said semiconductor memory device.

6. The device according to claim 5, wherein said means for storing includes a means for detecting an address change, delay means for delaying an output of said means for detecting an address change to provide a delayed address change signal, and logic means for controlling storing of said defect signal in said register means in response to said delayed address change signal and a write enable signal.

7. A semiconductor memory device having a self-testing function, comprising:

a memory array having a plurality of memory cells divided into a plurality of subarrays;

a plurality of function terminals for carrying input and output signals to control functions of said semiconductor memory device, said input and output signals including signals not directed to results of said self-testing function;

decoder means for designating corresponding memory cells in said plurality of subarrays when writing data to and reading data from said plurality of subarrays;

means for comparing data read out from corresponding memory cells in said plurality of subarrays and for generating a defect signal if data stored in any of the corresponding memory cells of a subarray of said plurality of subarrays are not coincident;

means, responsive to a change of an address signal generated by said decoder means, for storing said defect signal in a register; and means for applying said defect signal from said register to a predetermined one of said plurality of function terminals of said memory semiconductor device.

8. The device according to claim 7, wherein said means for storing includes a means for detecting an address change, delay means for delaying an output of said means for detecting an address change to provide a delayed address change signal, and logic means for controlling storing of said defect signal in said register in response to said delayed address change signal and a write enable signal.

* * * * *